United States Patent
Toraichi et al.

(10) Patent No.: US 7,979,480 B2
(45) Date of Patent: Jul. 12, 2011

(54) DISCRETE SIGNAL PROCESSING DEVICE AND PROCESSING METHOD

(75) Inventors: Kazuo Toraichi, Tsukuba (JP);
Tomoyuki Takahashi, Fukushima (JP);
Tohru Kawabe, Tsukuba (JP); Kazuki Katagishi, Tsukuba (JP); Kouji Nakamura, Tsukuba (JP)

(73) Assignee: Japan Science and Technology Agency, Saitama (JP)

( * ) Notice: Subject to any disclaimer, the term of this patent is extended or adjusted under 35 U.S.C. 154(b) by 1199 days.

(21) Appl. No.: 11/572,737

(22) PCT Filed: Jul. 14, 2005

(86) PCT No.: PCT/JP2005/013034
§ 371 (c)(1),
(2), (4) Date: Jan. 26, 2007

(87) PCT Pub. No.: WO2006/011371
PCT Pub. Date: Feb. 2, 2006

(65) Prior Publication Data
US 2008/0207160 A1    Aug. 28, 2008

(30) Foreign Application Priority Data
Jul. 27, 2004  (JP) .................................. 2004-218460

(51) Int. Cl.
*G06F 17/00*    (2006.01)
(52) U.S. Cl. ........................................ 708/200
(58) Field of Classification Search .................. None
See application file for complete search history.

(56) References Cited

U.S. PATENT DOCUMENTS

| | | | |
|---|---|---|---|
| 6,255,968 B1 | 7/2001 | Kitagawa | |
| 6,791,482 B2 | 9/2004 | Koyanagi | |
| 2004/0139135 A1* | 7/2004 | Druck | 708/319 |
| 2007/0136410 A1* | 6/2007 | Barford | 708/300 |
| 2008/0104163 A1* | 5/2008 | Barford | 708/620 |
| 2008/0207160 A1* | 8/2008 | Toraichi et al. | 455/334 |
| 2009/0306936 A1* | 12/2009 | Kawabata et al. | 702/189 |

FOREIGN PATENT DOCUMENTS

| | | |
|---|---|---|
| CN | 1426628 A | 6/2003 |
| JP | 2000-013226 | 1/2000 |
| JP | 2001-069010 | 3/2001 |

OTHER PUBLICATIONS

J. Romero et al, "Using root distribution of specific functions in signal recovery from Non-uniform samples", 1994 Canadian Conference on Electrical and Computer Engineering, Sep. 25-28, 1994, pp. 473-476.

J. Romero et al, "On-line SVD-based iterative method for signal recovery from nonuniform Samples", IEEE Electronics Letters, vol. 32, Issue 1, Jan. 4, 1996, pp. 20-21.

* cited by examiner

*Primary Examiner* — David H Malzahn
(74) *Attorney, Agent, or Firm* — Mattingly & Malur, P.C.

(57) ABSTRACT

A signal processing device and a signal processing method are provided which can reproduce a smooth signal in the reproduction of a discrete signal having a non-uniform sample point interval. The device includes a coefficient calculation unit 4 that inputs a sample point signal E2 representative of the time of a sample point of a discrete signal E1 having a non-uniform sample point interval to obtain a coefficient of a sampling function corresponding to the discrete signal, and a reproduction signal calculation unit 5 that obtains a continuous reproduction signal E3 by calculating and outputting a function value within the sample point interval from the discrete signal and the value of the coefficient outputted by the coefficient calculation unit.

21 Claims, 4 Drawing Sheets

| x1 | t1 |
| x2 | t2 |
| x3 | t3 |
| x4 | t4 |

DISCRETE SIGNAL PROCESSING DEVICE AND PROCESSING METHOD

TECHNICAL FIELD

The present invention relates to a processing device and a processing method effective for sampling a continuous signal and the reproduction from a sampled signal, that is, a discrete signal, and more particularly to a signal processing device and a signal processing method effectively applied to image signals, acoustic signals, or signals obtained by extracting the contours of images.

BACKGROUND ART

Sampling of a continuous signal is performed by a sampler (sampling circuit) that takes out a signal value of a continuous signal for each of a plurality of sample points which have a fixed interval. When the continuous signal is an analog signal, a discrete signal (sampling signal) turns into a digital signal by being quantized and coded. A digital signal thus subjected to analog-digital conversion is reproduced as a continuous signal via a discrete signal in an digital-analog conversion. For sampling performed with a fixed interval, a method of obtaining a reproduction signal from a discrete signal by convoluting operations on a discrete signal and a sampling function is known (e.g., Japanese Patent Laid-open No. 2000-13226).

DISCLOSURE OF THE INVENTION

In the process of obtaining a discrete signal from a continuous signal, when the signal intervals differ because of a change in the sampling timing of the sampler due to noise or jitter (temporal fluctuation of signal), conventionally, the signals have been treated as having a fixed interval, and as a result, signal operation processing and reproduction have not been suitably performed.

As a sampling function having a uniform interval, a piecewise polynomial function is shown in FIG. 9. This function is represented as a quadratic piecewise polynomial differentiable once in all points, and is composed with a quadratic B-spline function $\{\phi_1(t)\}$ shown in an expression (1) below as a base.

$$\phi_l(t) \equiv \int_{-\infty}^{\infty} \left( \frac{\sin \pi fh}{\pi fh} \right)^3 e^{j2\pi f(t-lh)} df \quad (1)$$

Here, h designates a shift interval, and l designates the number of shifts. By linearly connecting the base, a quadratic fluency sampling function $\Psi(t)$ of an expression (2) as shown in FIG. 9 is derived.

$$\psi(t) = \sum_{l=-1}^{1} \lambda_l \phi_l(t) \quad \{\lambda_l\} = \left\{ -\frac{1}{2}, 2, \frac{1}{2} \right\} \quad (2)$$

The sampling function, a shift interval h is half of a sample interval and the entire span is defined as J, is represented as continuous quadratic expressions in eight spans of a half sample point each, and is given as a quadratic continuous polynomial differentiable once in all points. In comparison with a Shannon's Sinc function, because of the nature of local support (the nature that the span in which a function is defined is limited to a finite span), the sampling function may work with calculations in a finite span, and is superior in calculation amounts, and then is applied to acoustic devices, image devices, and the like.

However, the sampling function thus derived presupposes the sampling of a uniform interval. When intervals of sample points deviate and the intervals become non-uniform, the continuity of differential coefficients in a joint of span (differentiable once) is not guaranteed, and a waveform holding angles is formed. Therefore, it becomes difficult to interpolate a smooth signal.

An object of the present invention is to provide a signal processing device and a signal processing method that can reproduce a smooth signal in the reproduction of a discrete signal having a non-uniform sample point interval.

The signal processing device according to the present invention for achieving the above-described object includes a coefficient calculation unit that inputs a second signal (that is, a sample point signal) representative of the time or position of sample points of non-uniform intervals to obtain a coefficient of a Sampling function, and a reproduction signal calculation unit that obtains a continuous reproduction signal by calculating and outputting a function value within a sample point interval from a first signal (that is, a discrete signal) sampled at the sample points and a value of the coefficient outputted by the coefficient calculation unit. Since a sampling function corresponding to each of the sample points of a discrete signal is determined, a smooth continuous signal can be reproduced.

A sampling function is a polynomial function represented by a continuous quadratic expression in each of 2n (n is an even integer of 2 or greater) number of intervals formed by halving each point interval. It comprises a quadratic continuous polynomial function differentiable once in a sample point and a middle point of a sample point interval, and has the value of 1 in a reference sample point and the value of zero in other sample points.

In the reproduction from a discrete signal having a non-uniform sample point interval, if a signal processing method that enables the reproduction of a smooth signal is achieved, the method can be used to choose proper parts of the discrete signal for the purpose of properizing the signal. The reason the method can be used is because the choosing operation enables the reproduction of a smooth signal even for non-uniform sample point intervals. A signal is properized, for example, by deleting a discrete signal of a disturbed sensor signal when a sensor signal from a sensor disposed in a remote location is disturbed because of a surge current during transmission. As another example of signal properizing, within a range permitted to compress signal transmission volumes, when a change is small before and after a sample point interval, the transmission of a discrete signal is halted until the change reaches a predetermined value.

According to the present invention, a proper signal can be reproduced for abnormality of input signals, deviation of input timing, and thinning out of sample values by signal compression and the like.

BEST MODE FOR CARRYING OUT THE INVENTION

Figure 1:
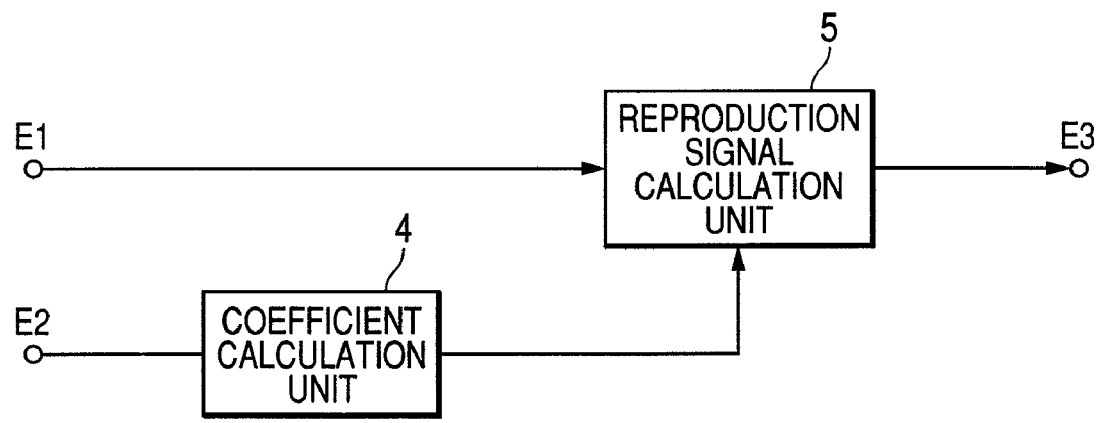
FIG. 1 is a block diagram for explaining a first embodiment of a signal processing device according to the present invention.

Hereinafter, a discrete signal processing device and a processing method according to an aspect of the present invention will be described in detail with reference to embodiments shown in the drawings. It is to be understood that same reference numerals in FIGS. 1, 4 to 6, and 8 indicate the same or similar items.

FIG. 1 shows a first embodiment of the present invention. In FIG. 1, the reference numeral 4 designates a coefficient calculation unit of a sampling function that inputs a sample point signal (second signal) E2 representative of time of sample points having non-uniform intervals and calculates coefficients of a sampling function optimum to a discrete signal having non-uniform intervals. 5 designates a reproduction signal calculation unit that calculates and outputs a reproduction signal E3 from the discrete signal (first signal) E1 having non-uniform intervals sampled for each of the sample points having non-uniform intervals and data of coefficients of the sampling function outputted by the coefficient calculation unit 4. Although not shown in FIG. 1, the sample point signal E2 can be obtained by timing pulse positions of sampling pulses having non-uniform intervals corresponding to the discrete signal having non-uniform intervals.

The following describes coefficient calculation of a sampling function performed by the coefficient calculation unit 4.

Figure 2:
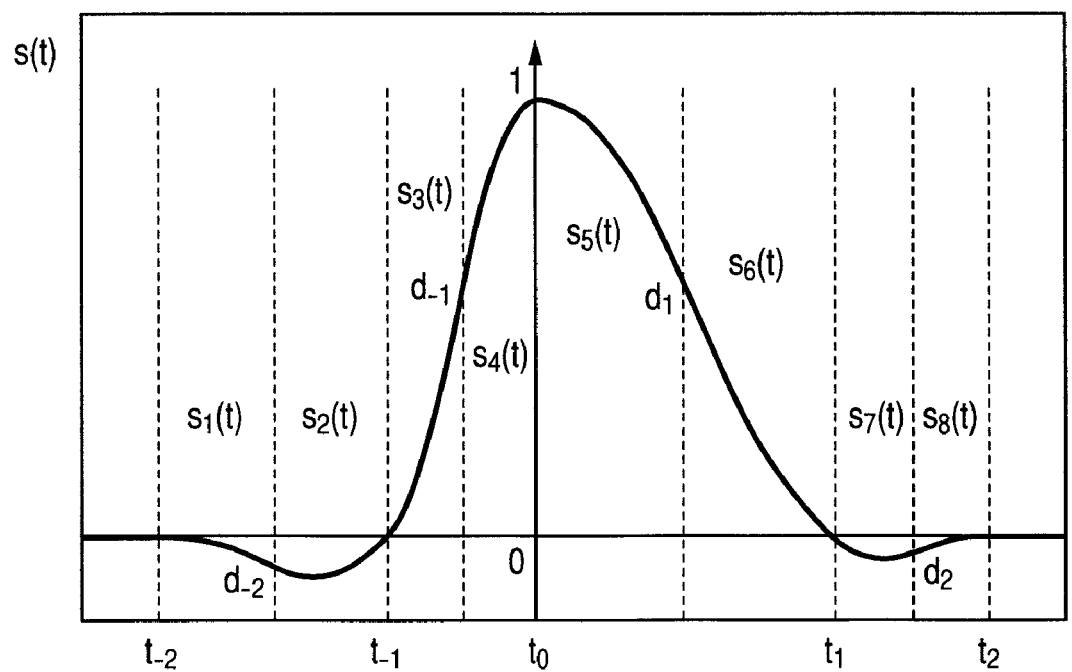
FIG. 2 is a curved line graph for explaining an example of a sampling function for a non-uniform interval of the present invention.

In FIG. 2, an example of a sampling function appropriate for a discrete signal having a non-uniform interval is shown in a thick solid line. For signal intervals given as non-uniform intervals, four sample spans of sample points $\{t_i\}$ (i=−2, −1, 0, 1, 2) of spans of local support are split into eight spans of $[t_i, (t_i+t_{i+1})/2]$ span each. The sampling function is represented in the expression (3) below where a function $s_i$ in each of the spans is represented by a quadratic expression of t. $t_i$ designating time and its value is shown by the sample point signal E2.

$$\begin{aligned}
s_1(t) &= a_1 t^2 + b_1 t + c_1 & \left[t_{-2}, \frac{t_{-2}+t_{-1}}{2}\right] \\
s_2(t) &= a_2 t^2 + b_2 t + c_2 & \left[\frac{t_{-2}+t_{-1}}{2}, t_{-1}\right] \\
s_3(t) &= a_3 t^2 + b_3 t + c_3 & \left[t_{-1}, \frac{t_{-1}+t_0}{2}\right] \\
s_4(t) &= a_4 t^2 + b_4 t + c_4 & \left[\frac{t_{-1}+t_0}{2}, t_0\right] \\
s_5(t) &= a_5 t^2 + b_5 t + c_5 & \left[t_0, \frac{t_0+t_1}{2}\right] \\
s_6(t) &= a_6 t^2 + b_6 t + c_6 & \left[\frac{t_0+t_1}{2}, t_1\right] \\
s_7(t) &= a_7 t^2 + b_7 t + c_7 & \left[t_1, \frac{t_1+t_2}{2}\right] \\
s_8(t) &= a_8 t^2 + b_8 t + c_8 & \left[\frac{t_1+t_2}{2}, t_2\right]
\end{aligned} \quad (3)$$

In the expression (3), the following conditions are given to determine the function:

(1) The function is continuous at joints (sample points and their intermediate points) of each function;

(2) Functions have a value of 0 in sample points other than $t_0$ in joints of each function;

(3) Function values in intermediate points of sample point intervals are determined so that errors in the sample points are minimized.

The sampling function determined from the above conditions can be represented by expression (4).

$$\begin{aligned}
s_1(t) &= -B_1(t-t_{-2})^2 \\
s_2(t) &= B_1(3t-t_{-1}-2t_{-2})(t-t_{-1}) \\
s_3(t) &= -B_2(3t-2t_0-t_{-1})(t-t_{-1}) + \frac{2(t-t_{-1})^2}{(t_0-t_{-1})^2} \\
s_4(t) &= B_2(t-t_0)^2 - \frac{2(t-t_0)^2}{(t_0-t_{-1})^2} \\
s_5(t) &= B_3(t-t_0)^2 - \frac{2(t-t_0)^2}{(t_0-t_{-1})^2} \\
s_6(t) &= -B_3(3t-2t_0-t_1)(t-t_1) + \frac{2(t-t_1)^2}{(t_0-t_1)^2} \\
s_7(t) &= B_4(3t-t_1-2t_2)(t-t_1) \\
s_8(t) &= -B_4(t-t_2)^2 \\
B_1 &= \frac{t_0-t_{-2}}{4(t_0-t_{-1})^2(t_{-1}-t_{-2})+4(t_{-1}-t_{-2})^3} \\
B_2 &= \frac{t_0-t_{-2}}{4(t_0-t_{-1})(t_{-1}-t_{-2})^2+4(t_0-t_{-1})^3} \\
B_3 &= \frac{t_2-t_0}{4(t_2-t_1)^2(t_1-t_0)+4(t_1-t_0)^3} \\
B_4 &= \frac{t_2-t_0}{4(t_2-t_1)(t_1-t_0)^2+4(t_2-t_1)^3}
\end{aligned} \quad (4)$$

In $s_i(t)$ of the above expression (4), the expression on the right side may be transformed to the format of a normal quadratic expression, that is, the format of expression (3) without any influence.

The coefficient calculation unit 4 in FIG. 1 calculates the above Bi expression or coefficients $a_i$, $b_i$, and $c_i$ represented by the format of the expression 3. Since these coefficients can be calculated only in a sample point $t_i$, the coefficient calculation unit 4 inputs the value (elapse time) of a sample point $\{t_i\}$ (i=−2, −1, 0, 1, 2), calculates each of coefficient values, and outputs the calculation results to the reproduction signal calculation unit 5.

The reproduction signal calculation unit 5 calculates functions $s_i(t)$ between sample points by an inner product operation from the discrete signal E1 and the output of the coefficient calculation unit 4. When the signal value of the discrete signal E1, that is, when a sample value is 1, an example of the sampling function obtained by connecting functions $s_i(t)$ between sample points is shown in FIG. 2. The sampling function outputs 1 in a reference sample point $t_0$, 0 in other sample points $t_{-2}$, $t_{-1}$, $t_1$, and $t_2$, and $d_{-2}$, $d_{-1}$, $d_1$, and $d_2$ in intermediate points in that order.

Figure 3:
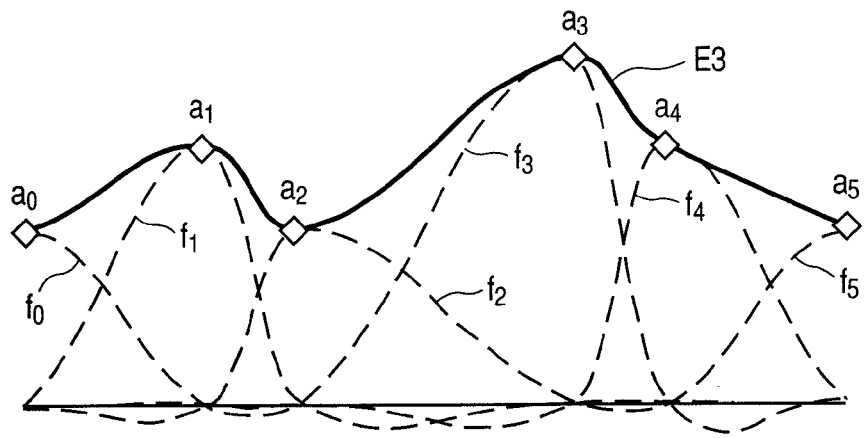
FIG. 3 is a drawing for explaining an example of signal production by the present invention.

By a linear combination of the sample value and the value of the corresponding sample function, a signal in the sample span is reproduced, and a smooth reproduction signal E3 is outputted. An example of the reproduction signal E3 is shown in FIG. 3. When sample values change to $a_0$ to $a_5$ according to transition of sample points, individual sampling functions $f_0$ to $f_5$ are respectively determined for them, and they are linearly combined to obtain a smooth continuous reproduction signal E3. In other words, the reproduction signal calculation unit 5 applies coefficient values of calculation results of the coefficient calculation unit 4 to polynomial functions to calculate sampling function values in predetermined positions or time within a sample point interval, obtains the product of the calculation value and the discrete signal, and outputs the sum of product values in the same interval as a reproduction signal.

In the above-described embodiment, a method of calculating coefficient values using the values of sample points $t_i$ has been shown. As is apparent from the expressions described previously, a transformed expression of a sample point interval may be used by setting a sample point interval, that is, $\Delta t_i = t_{i+1} - t_i$ as an input of the coefficient calculation unit. In this embodiment, it is apparent that not only the signal of a time series can be targeted but also pixel positions can be treated as sample points in an image. An image position is indicated by coordinates, and sample points are represented by coordinate points. Although the number of sample intervals of the above-described sampling function of the present invention is four, the number of intervals is not limited to this; it is possible to have n intervals (n is an even integer of two or greater).

By adding new conditions according to the degree of non-uniformity, there may be a case where satisfactory signal reproduction can be obtained. An example of the conditions is to define function values of a sampling function in the middle point of a sample point interval so that they are symmetrical with respect to a reference sample point. Another example is to define the function values of the sampling function in the middle point of the sample point interval so that they are approximated to the values of a sampling function having a uniform interval with a minimum error.

Although the signal processing device of this embodiment may be constructed by hardware by using digital circuits and memories for individual units, it may also be constructed by software to run computer by programs. In this case, the signal processing device primarily comprises a central processing unit (CPU), a memory for temporarily storing data and the like being calculated, and a file device for storing a signal processing program and sampling functions. The signal processing program tells procedures by, which the computer executes processing by the coefficient calculation unit 4 and the reproduction signal calculation unit 5. The signal processing program may be stored in media such as CD-ROM (Compact Disc-Read Only Memory) to be executed as an independent program.

By using the above-described signal processing method of the present invention that reproduces a smooth signal for a discrete signal having non-uniform sample point intervals, signal can be properized by deleting a disturbed part of the discrete signal having a uniform interval.

Figure 4:
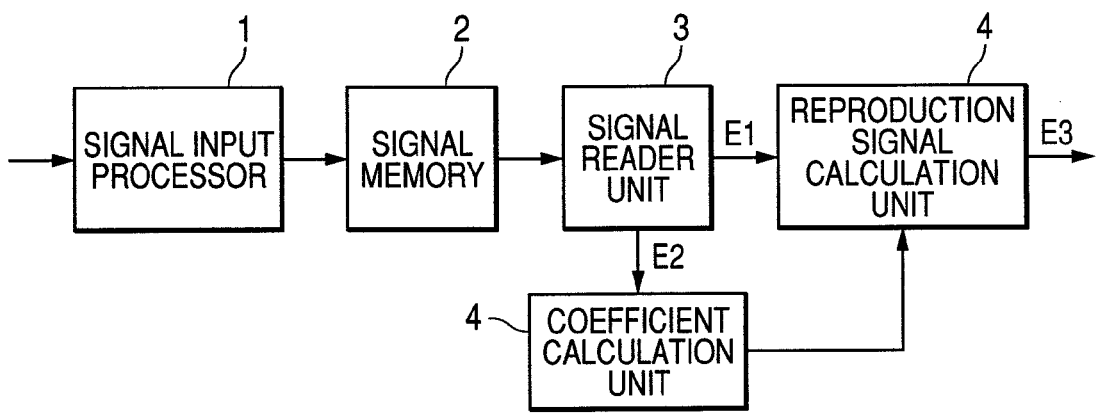
FIG. 4 is a block diagram for explaining a second embodiment of the present invention.

FIG. 4 shows a second embodiment of the present invention. In this embodiment, for example, when a sensor signal is transmitted from a sensor disposed remotely and recorded, when a part of the sensor signal is disturbed due to the occurrence of a surge current in the course of transmission, a disturbed part of the discrete signal is deleted and recorded. In reproduction after the recording, a smooth reproduction signal is obtained by a sampling function according to the present invention. In this embodiment, an input signal changes with time, like the above-described sensor signal. In FIG. 4, 1 designates a signal input processor, 2 designates a signal memory, 3 designates a signal reader unit from the signal memory 2, 4 designates a coefficient calculation unit of a sampling function, and 5 designates a reproduction calculation unit. A signal reproduction unit is constructed by the coefficient calculation unit 4 and the reproduction signal calculation unit 5.

Figure 5:
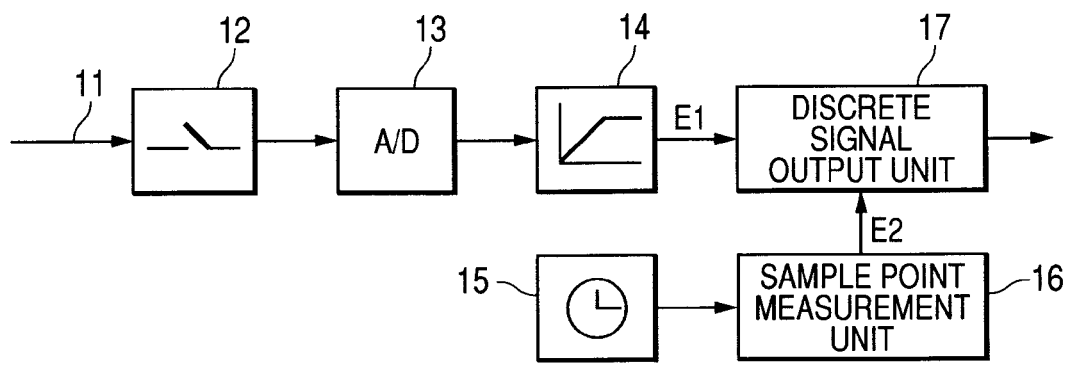
FIG. 5 is a block diagram for explaining an input signal processor of a second embodiment.

FIG. 5 shows the structure of the signal input processor 1. In FIG. 5, 11 designates an inputted continuous signal, 12 designates a sampler for sampling the continuous signal 11 by a sampling pulse, and 13 designates an AD (Analog to Digital) converter for digitalizing a sampled discrete signal. The AD converter 13 and the preceding components are remotely disposed, and a discrete signal subjected to AD conversion outputted by the AD converter 13 is transmitted. In FIG. 5, 14 designates a signal propriety judging unit for judging the propriety of the transmitted discrete signal. The signal propriety judging unit 14, during input of the discrete signal, reproduces a timing signal corresponding to a sample point of the discrete signal, that is, a sampling pulse. 15 designates a timer, and 16 designates a sample point measurement unit that reads the pulse position of a sampling pulse after judgment outputted by the signal propriety judging unit 14 by time from the timer 15, and outputs the read time as a sample point signal E2 representative of a sample point. 17 designates a discrete signal output unit that outputs the discrete signal E1 outputted as a proper signal of the signal propriety judging unit 14 and the sample point signal E2 outputted from the sample point measurement unit 16 as a pair of discrete signal data. Discrete signal data outputted by the discrete signal output unit 17 is stored in the signal memory 2.

Figures 6, 7:
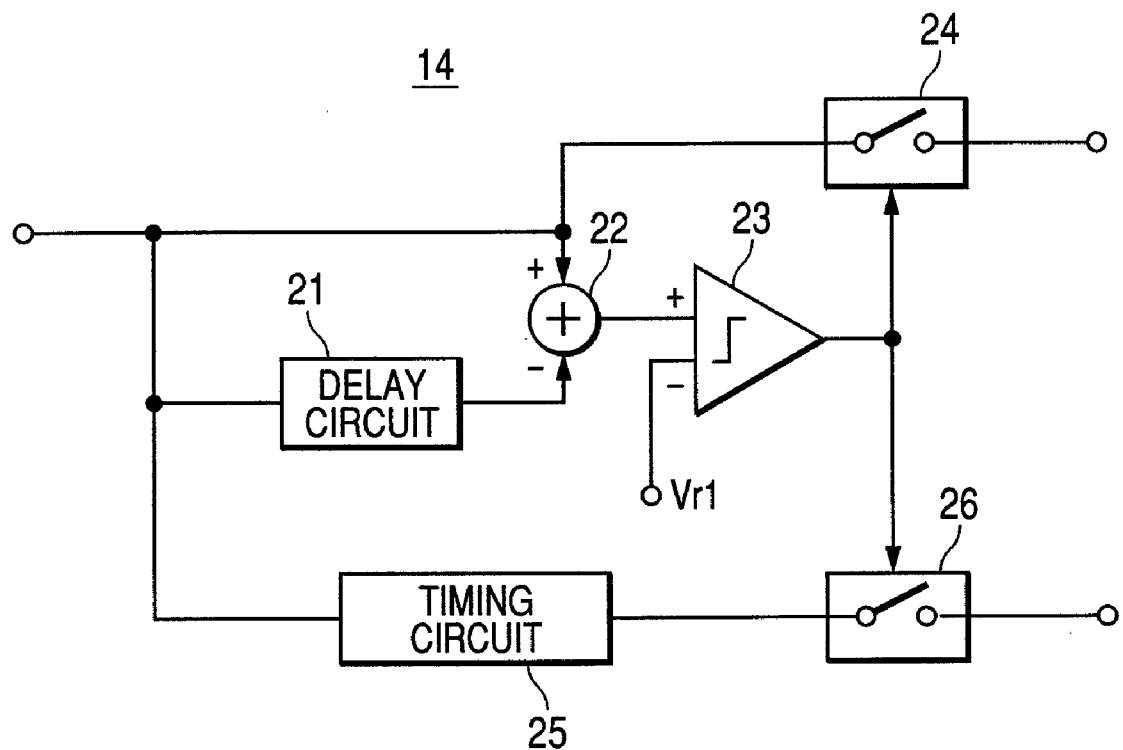
FIG. 6 is a block diagram for explaining a signal propriety judging unit of a second embodiment.
FIG. 7 is a drawing for explaining the data format of a signal memory of a second embodiment.

FIG. 6 shows the structure of the signal propriety judging unit 14. In FIG. 6, 21 designates a delay circuit that outputs a discrete signal at the first preceding sample point of an inputted discrete signal. 22 designates a subtracter that outputs the absolute value of a difference between the inputted discrete signal and a discrete signal at the first preceding sample point. 23 designates a comparator that compares an output of the subtracter 22 and a reference voltage Vr1. 24 and 26 designate switches that open or close according to a comparison result of the comparator 23. 25 designates a timing circuit that extracts a sampling pulse corresponding to an inputted discrete signal from it. The comparator 23, when a sudden change exceeding the reference voltage Vr1 after one sample point occurs, outputs a comparison result, turns off the switches 24 and 26, and cuts off the discrete signal and a sampling pulse outputted by the timing circuit 25. Thereby, a discrete signal that suddenly changes after one sample point is determined to be improper, and is cut off. A discrete signal determined to be proper and a sampling pulse corresponding to it are outputted from the switches 24 and 26, respectively. When it is supposed that the sudden change does not end in one sample point and continues to several sample points, a holding circuit which holds the comparison result in the output of the comparator 23 for a specified time is connected.

FIG. 7 shows an example of the data format of discrete signal data stored in the signal memory 2. For each sample points, data $x_j$ (j=1, 2, 3, ... ) of discrete signal and data $t_j$ of sample point signal are stored as a pair of discrete signal data. The signal memory 2 may be any of media such as a semiconductor memory such as nonvolatile memory, hard disk, compact disk (CD), digital versatile disk (DVD), and flexible disk.

The signal reader unit 3 in FIG. 4 successively reads a pair of data including a discrete signal and a sample point signal stored in the signal memory 2, and outputs the sample point signal E2 to the coefficient calculation unit 4 of the sampling function, and the discrete signal E1 to the reproduction signal calculation unit 5. The coefficient calculation unit 4 and the reproduction signal calculation unit 5 are the same as those described in the first embodiment. A smooth reproduction signal is outputted from the reproduction signal calculation unit 5.

According to this embodiment, a disturbed part of a discrete signal is deleted to properize the signal, and a discrete signal having a non-uniform interval as a result of the properization can be reproduced to a smooth signal.

In this embodiment, as an example, a sensor signal is transmitted from a remote location. However, the present invention is not limited to such an example. For example, when output data of the AD converter 13 is recorded in recording media (CD, DVD, or magnetic tape or the like) and the data is reproduced from the recording media, the present invention can also apply to a possibly disturbed reproduction because of scratches and deposited dust contained in the recording media.

In the above description, although discrete signal data outputted by the discrete signal output unit 17 is stored in the signal memory 2, the discrete signal data may be supplied to the signal reproduction unit without passing through the signal memory 2.

A third embodiment of the present invention will be described with reference to FIG. 8. In this embodiment, by stopping transmission of a discrete signal until a change of a sample value reaches a predetermined value, a signal transmission volume is compressed. The third embodiment is the same as the second embodiment, except the structure of the signal propriety judging part.

Figure 8:
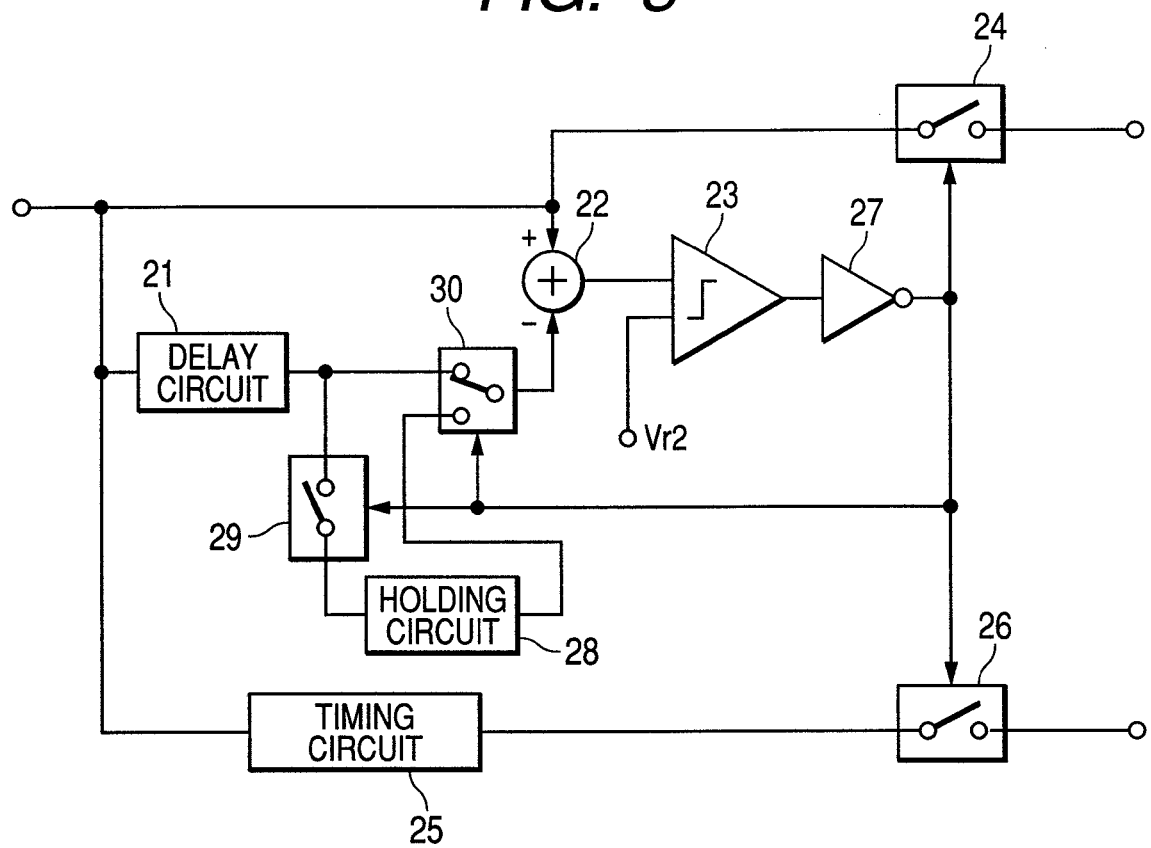
FIG. 8 is a block diagram for explaining a third embodiment of the present invention.
Figure 9:
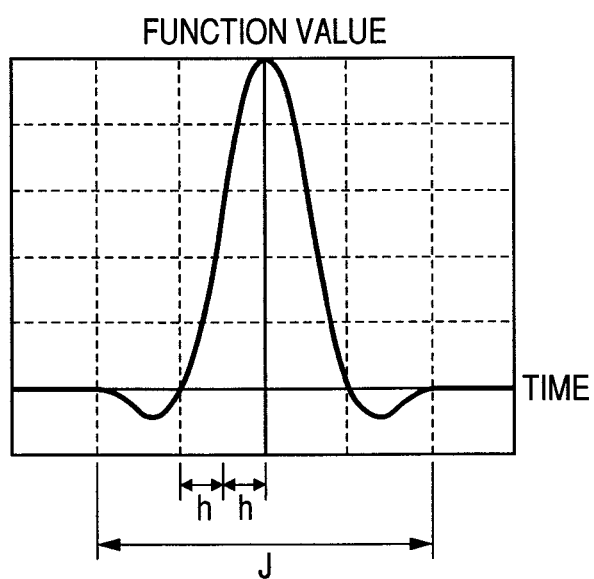
FIG. 9 is a curved line graph for explaining an example of a sampling function.

FIG. 8 shows a structure of the signal propriety judging unit. In FIG. 8, 21 designates a delay circuit that outputs a discrete signal of the first preceding sample point of an inputted discrete signal. 28 designates a holding circuit that always inputs a discrete signal outputted by the delay circuit 21 but holds the discrete signal when the input is cut off, to the value immediately before the cut off. 30 designates a changeover switch that switches between a discrete signal outputted by the delay circuit 21 and a discrete signal outputted by the holding circuit 28. 22 designates a subtracter that outputs the absolute value of a difference between an inputted discrete signal and a discrete signal outputted by the changeover switch 30. 23 designates a comparator that compares output of the subtracter 22 and a reference voltage Vr2. 27 designates a switch that is connected to the comparator 23 and outputs an inverse comparison result. 24, 26 and 29 designate switches that open or close according to an inverse comparison result. 25 designates a timing circuit that extracts a sampling pulse corresponding to an inputted discrete signal from it.

The comparator 23, connected to the inverter 27, when a discrete signal does not exceed the reference voltage Vr2 after one sample point, outputs an inverse comparison result until a difference between the discrete signal and a discrete signal inputted in succession to the discrete signal exceeds the reference voltage Vr2, turns off the switches 24, 26, and 29, connects the changeover switch 30 to the holding circuit 28, and cuts off a discrete signal and a sampling pulse outputted by the timing circuit. By this construction, a discrete signal not exceeding the reference voltage Vr2 after one sample point is determined to be improper, and cut off. A discrete signal determined to be proper and a sampling pulse corresponding to it are outputted from the switches 24 and 26, respectively.

According to this embodiment, the transmission of a discrete signal is stopped until a change of sample values after a sample point reaches a predetermined value, and at the same time, a discrete signal having a non-uniform interval as a result of the properization can be reproduced to a smooth signal. Therefore, a signal transmission volume can be compressed.

Also in this embodiment, discrete signal data outputted by the discrete signal output unit 17 may be supplied to the signal reproduction unit without passing through the signal memory 2.

The invention claimed is:

1. A signal processing device, wherein a first signal sampled at sample points of non-uniform intervals and a second signal representative of time or position of the sample points are input to the device; the device obtains a product of a value of a sampling function determined by the second signal and a magnitude of the first signal, the product being obtained for each of the sample points; and the device reproduces a signal within a sample point interval by linearly combining the values of the product obtained for each of the sample points.

2. The signal processing device according to claim 1, wherein the sampling function is a polynomial function represented by a continuous quadratic expression in each of 2n number of intervals formed by halving each sample point interval, comprises a quadratic continuous polynomial function differentiable once in the sample point and a middle point of the sample point interval, and has a value of 1 in a reference sample point and a value of zero in other sample points.

3. The signal processing device according to claim 1, wherein the second signal is represented by elapse time when the first signal is a time series signals and represented by a coordinate point when the first signal is a signal indicated using a coordinate.

4. The signal processing device according to claim 1, wherein the second signal is represented by a time interval or a distance between adjacent sample points.

5. A signal processing device comprising:
a coefficient calculation unit that receives a second signal representative of time or position of sample points of non-uniform intervals to obtain a coefficient of a sampling function; and
a reproduction signal calculation unit that obtains a continuous reproduction signal by calculating and outputting a function value within a sample point interval from a first signal sampled at the sample points and a value of the coefficient outputted by the coefficient calculation unit.

6. The signal processing device according to claim 5, wherein the reproduction signal calculation unit applies the value of the coefficient outputted by the coefficient calculation unit to a polynomial function to calculate a value of the sampling function in predetermined time or position within the sample point interval, obtains product of a calculation value as a result of the calculation and a signal value of the first signal, and outputs sum of obtained product values in the predetermined time or position within the sample point interval as a reproduction signal.

7. A signal processing device comprising:
a coefficient calculation unit that receives a second signal representative of time or positions of sample points of non-uniform intervals to obtain a coefficient of a sampling function; and
a reproduction signal calculation unit that performs an inner product operation for obtaining a function value within a sample point interval from a first signal sampled at the above sample points of non-uniform intervals and a value of the sampling function determined from a value of the coefficient outputted by the coefficient calculation unit, and obtains a continuous reproduction signal by linear combination of the function values obtained for each of the sample points.

8. A signal processing method of a signal processing device which includes a signal reception unit and a signal calculation unit, comprising the steps of:

receiving with the signal reception unit, as inputs, a first signal sampled at sample points of non-uniform intervals and a second signal representative of time or position of the sample points;

obtaining with the signal calculation unit product of a value of a sampling function determined by the second signal and a magnitude of the first signal, the product being obtained for each of the sample points; and reproducing with the signal calculation unit a signal within a sample point interval by linear combination of values of the product obtained for each of the sample points.

9. The signal processing method according to claim 8, wherein the sampling function is a polynomial function represented by a continuous quadratic expression in each of 2n number of intervals formed by halving each sample point interval, comprises a quadratic continuous polynomial function differentiable once in a sample point and a middle point of a sample point interval, and has a value of 1 in a reference sample point and a value of zero in other sample points.

10. The signal processing method according to claim 8, wherein a function value of the sampling function in a middle point of a sample point interval is determined by a predetermined condition.

11. The signal processing method according to claim 10, wherein the predetermined condition is indicated by defining the function value of the sampling function in the middle point of the sample point interval so that the function value is symmetrical with respect to a reference sample point.

12. The signal processing method according to claim 10, wherein the predetermined condition is indicated by defining the function value of the sampling function in the middle point of the sample point interval so that the function value of the sampling function is approximated to a value of a sampling function having a uniform interval with a minimum error.

13. A signal processing method of a signal processing device which includes a coefficient calculation unit and a reproduction signal calculation unit, comprising the steps of:
receiving with the coefficient calculation unit, as an input, a second signal representative of time or position of sample points of non-uniform intervals to obtain a coefficient of a sampling function; and
obtaining with the reproduction signal calculation unit a continuous reproduction signal by calculating and outputting a function value within a sample point interval from a first signal sampled at the sample points and a value of the coefficient of the sampling function.

14. A signal processing method of a signal processing device which includes a coefficient calculation unit and a reproduction signal calculation unit, comprising the steps of:
receiving with the coefficient calculation unit, as an input, a second signal representative of time or position of sample points of non-uniform intervals to obtain a coefficient of a sampling function;
performing with the reproduction signal calculation unit an inner product operation for obtaining a function value within a sample point interval from a first signal sampled at the sample points of non-uniform intervals and a value of the sampling function determined from a value of the coefficient; and
obtaining with the reproduction signal calculation unit a continuous reproduction signal by linear combination of the function values obtained for each of the sample points.

15. A signal processing device comprising:
a signal propriety judging unit that determines whether or not a first signal obtained by sampling a continuous signal is proper;
a sample point measuring unit that, when the first signal is proper, produces a second signal representative of time or position of sample points of the first signal; and
a signal reproducing unit that, when the first signal is determined to be proper, obtains a continuous reproduction signal based on the first signal and the second signal,
wherein the signal reproducing unit comprises:
a coefficient calculation unit that receives the second signal to obtain a coefficient of a sampling function; and
a reproduction signal calculation unit that obtains the continuous reproduction signal by calculating and outputting a function value within a sample point interval from the first signal determined to be proper and the value of the coefficient outputted by the coefficient calculation unit.

16. The signal processing device according to claim 15, wherein the signal propriety judging unit judges propriety by whether or not, comparing with a first sample value of the first signal, a second sample value of the first signal whose sample point is adjacent to a sample point of the first sample value exceeds a predetermined reference value, and judges that the first signal is improper when it exceeds the reference value.

17. The signal processing device according to claim 15, wherein the signal propriety judging unit judges propriety by whether or not, comparing with a first sample value of the first signal, a second sample value of the first signal that is continuous to the first sample value of the first signal exceeds a predetermined reference value, and judges that the first signal is proper when it exceeds the reference value.

18. A signal processing method of a signal processing device which includes a signal propriety judging unit, a sample point measuring unit and a signal reproducing unit, comprising:
a first step of determining with the signal propriety judging unit whether or not a first signal obtained by sampling a continuous signal is proper;
a second step of, when the first signal is proper, producing with the sample point measuring unit a second signal representative of time or position of sample points of the first signal; and
a third step of, when the first signal is determined to be proper, obtaining with the signal producing unit a continuous reproduction signal based on the first signal and the second signal,
wherein the third step includes:
a fourth step of receiving with the signal reproducing unit the second signal to obtain a coefficient of a sampling function; and
a fifth step of obtaining with the signal reproducing unit the continuous reproduction signal by calculating and outputting a function value within a sample point interval from the first signal determined to be proper and the value of the coefficient of the sampling function.

19. The signal processing method according to claim 18, wherein, in the first step, propriety is judged by whether or not, comparing with a first sample value of the first signal, a second sample value of the first signal whose sample point is adjacent to a sample point of the first sample value exceeds a predetermined reference value, and the first signal is determined to be improper when it exceeds the reference value.

20. The signal processing method according to claim 18, wherein, in the first step, propriety is judged by whether or not, comparing with a first sample value of the first signal, a second sample value of the first signal that is continuous to the first sample value of the first signal exceeds a predetermined reference value, and the first signal is determined to be improper when it exceeds the reference value.

21. A signal processing method of a signal processing device which includes a reproduction signal calculation unit, comprising the step of:

reproducing with the reproduction signal calculation unit a signal value within a sample point interval by using a value of a first signal whose sample points are of non-uniform intervals and a sampling function determined by a second signal representative of time or position of the sample points of the non-uniform intervals.

* * * * *